US008561418B2

(12) United States Patent
Bash et al.

(10) Patent No.: US 8,561,418 B2
(45) Date of Patent: Oct. 22, 2013

(54) REFRIGERATION SYSTEM WITH PARALLEL EVAPORATORS AND VARIABLE SPEED COMPRESSOR

(75) Inventors: Cullen E. Bash, San Francisco, CA (US); Abdlmonem H. Beitelmal, Los Altos, CA (US); Ratnesh K. Sharma, Union City, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 201 days.

(21) Appl. No.: 13/018,082

(22) Filed: Jan. 31, 2011

(65) Prior Publication Data

US 2011/0120156 A1 May 26, 2011

Related U.S. Application Data

(62) Division of application No. 11/142,558, filed on Jun. 1, 2005, now Pat. No. 7,895,854.

(51) Int. Cl.
*F25B 1/00* (2006.01)
*F25B 5/00* (2006.01)
*H05K 7/20* (2006.01)

(52) U.S. Cl.
USPC ............................ 62/228.4; 62/117; 361/698

(58) Field of Classification Search
USPC ................. 62/228.4, 259.2, 259.4, 199, 117; 165/80.4, 104.33, 292; 361/698, 699, 361/700, 702
See application file for complete search history.

(56) References Cited

U.S. PATENT DOCUMENTS

| | | |
|---|---|---|
| 3,334,684 A | 8/1967 | Mazorol, Jr. et al. |
| 4,997,031 A | 3/1991 | Kashiwada et al. |
| 5,186,020 A | 2/1993 | Rockenfeller et al. |
| 5,187,950 A | 2/1993 | Weldon |
| 5,706,668 A | 1/1998 | Hilpert |
| 5,791,983 A | 8/1998 | Robertson |
| 6,164,369 A | 12/2000 | Stoller |
| 6,182,742 B1 | 2/2001 | Takahashi et al. |
| 6,415,619 B1 * | 7/2002 | Bash et al. ............ 62/228.4 |
| 6,467,295 B2 | 10/2002 | Oh et al. |
| 6,490,877 B2 | 12/2002 | Bash et al. |
| 6,574,104 B2 | 6/2003 | Patel et al. |
| 6,628,520 B2 | 9/2003 | Patel et al. |
| 6,772,604 B2 | 8/2004 | Bash et al. |
| 6,775,997 B2 | 8/2004 | Bash et al. |
| 6,786,056 B2 | 9/2004 | Bash et al. |
| 6,832,489 B2 | 12/2004 | Bash et al. |
| 6,832,490 B2 | 12/2004 | Bash et al. |
| 6,834,512 B2 | 12/2004 | Bash et al. |
| 6,854,284 B2 | 2/2005 | Bash et al. |
| 6,868,683 B2 | 3/2005 | Bash et al. |
| 6,876,549 B2 | 4/2005 | Beitelmal et al. |
| 6,945,058 B2 | 9/2005 | Bash et al. |

(Continued)

*Primary Examiner* — Chen Wen Jiang

(57) ABSTRACT

A refrigeration system for controlling airflow around an air-cooled heat generating device having a plurality of components includes a refrigerant line split into second refrigerant lines, which are arranged in a parallel configuration with respect to each other. Evaporators are positioned along the second refrigerant lines and in the path of airflow supplied into the components or airflow exhausted from the components. The refrigeration system further includes a variable speed compressor and a controller for controlling the speed of the variable speed compressor. Furthermore, the refrigeration system includes a temperature sensor configured to transmit signals related to a detected temperature to the controller, and the controller is configured to vary the speed of the variable speed compressor based upon the detected temperature.

1 Claim, 6 Drawing Sheets

(56) References Cited

U.S. PATENT DOCUMENTS

| | | |
|---|---|---|
| 6,981,915 B2 | 1/2006 | Moore et al. |
| 7,010,392 B2 | 3/2006 | Bash et al. |
| 7,086,459 B2 | 8/2006 | Beitelmal et al. |
| 7,248,942 B2 | 7/2007 | Bash et al. |
| 7,259,963 B2 * | 8/2007 | Germagian et al. .......... 361/695 |
| 2002/0124585 A1 | 9/2002 | Bash et al. |
| 2002/0157409 A1 | 10/2002 | Pham et al. |
| 2003/0010051 A1 | 1/2003 | Lecke et al. |
| 2003/0085025 A1 | 5/2003 | Woods et al. |
| 2003/0167783 A1 * | 9/2003 | Goth et al. ...................... 62/157 |
| 2004/0020224 A1 | 2/2004 | Bash et al. |
| 2004/0020226 A1 | 2/2004 | Bash et al. |
| 2004/0050231 A1 | 3/2004 | Chu et al. |
| 2004/0221604 A1 | 11/2004 | Ota et al. |
| 2005/0122685 A1 | 6/2005 | Chu et al. |
| 2005/0207116 A1 | 9/2005 | Yatskov et al. |
| 2006/0272342 A1 | 12/2006 | Bash et al. |

* cited by examiner

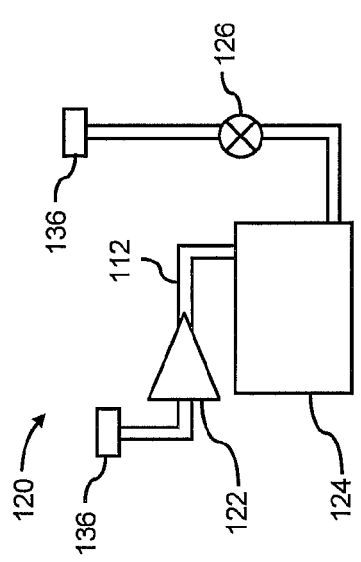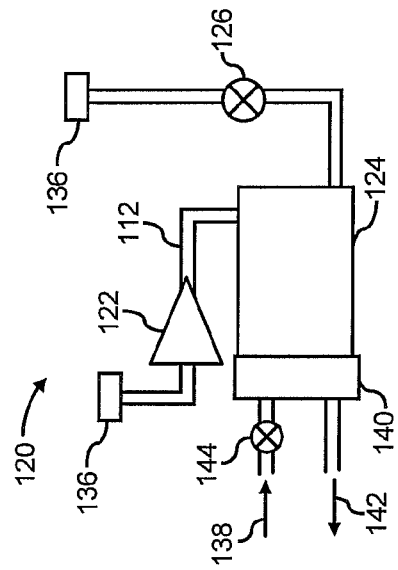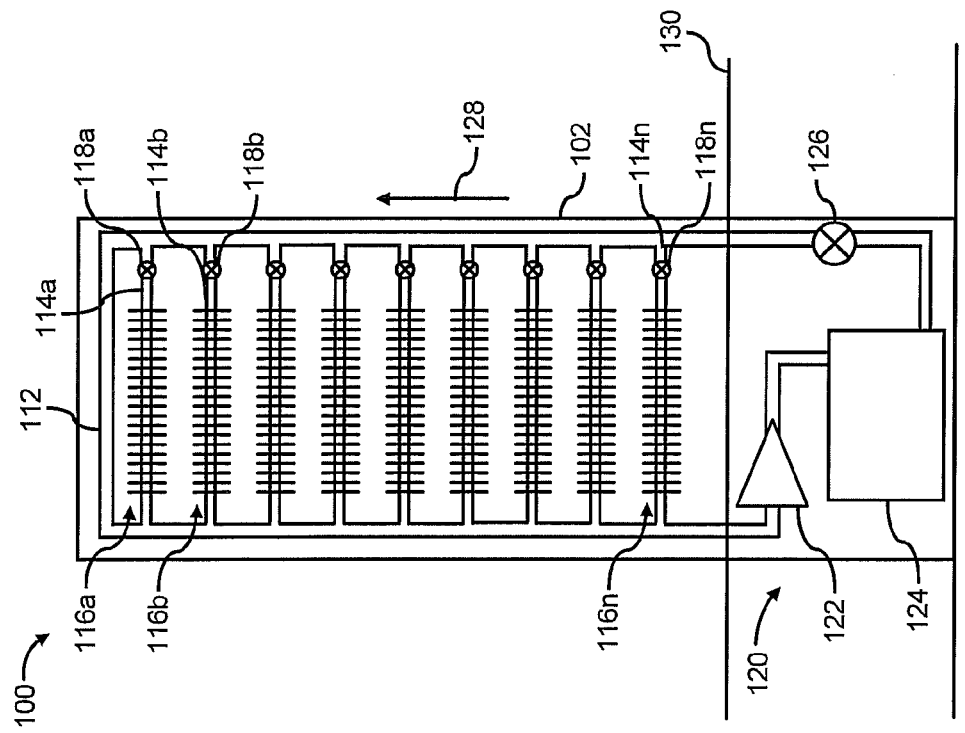

REFRIGERATION SYSTEM WITH PARALLEL EVAPORATORS AND VARIABLE SPEED COMPRESSOR

CLAIM FOR PRIORITY

This application is a divisional application of U.S. patent application Ser. No. 11/142,558, filed on Jun. 1, 2005, now U.S. Pat. No. 7,895,854 the disclosure of which is hereby incorporated by reference in its entirety.

CROSS-REFERENCE TO OTHER APPLICATIONS

The present application has the same Assignee and shares some common subject matter with U.S. patent application Ser. No. 11/142,5557, entitled "Air-Cooled Heat Generating Device Airflow Control System", filed on even date herewith, and U.S. patent application Ser. No. 11/142,556, entitled "Air-Cooled Device Refrigeration System with Parallel Evaporators", filed on even data herewith. The disclosures of the above-listed applications are incorporated herein by reference in their entireties.

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Some of the racks contained in the data center may dissipate greater levels of heat as compared to other racks in the data center. This may occur, for instance, in situations where some of the racks contain greater densities of computer systems or a larger number of computer systems that are operating at higher levels. Conventional data centers are typically equipped with a raised floor with static ventilation tiles configured to provide cool air to the computer systems from a pressurized plenum in the space below the raised floor. In most instances, the level and temperature of the airflow supplied through the ventilation tiles is the same or similar for all of the ventilation tiles. As such, those racks that dissipate greater levels of heat often receive cooling airflow that is insufficient to maintain the temperatures of the computer systems contained therein within predefined parameters. This may lead to a shutdown or damage to the computer systems.

It would thus be desirable to ensure that the computer systems in the racks receive airflow at sufficient levels and at adequate temperatures.

SUMMARY

A refrigeration system for controlling airflow around an air-cooled heat generating device having a plurality of components is disclosed herein. The refrigeration system includes a variable speed compressor for controlling the flow of refrigerant through a refrigerant line, the refrigerant line is split into second refrigerant lines over a portion of the refrigerant line, and the second refrigerant lines are arranged in a parallel configuration with respect to each other. Evaporators are positioned along the second refrigerant lines and are positioned in the path of airflow around the components. Furthermore, the refrigeration system includes a temperature sensor positioned to detect temperature at a location with respect to the heat generating device. The temperature sensor is also configured to transmit signals related to the detected temperature to the controller and the controller is configured to vary the speed of the variable speed compressor based upon the signals received from the temperature sensor.

BRIEF DESCRIPTION OF THE DRAWINGS

Features of the present invention will become apparent to those skilled in the art from the following description with reference to the figures, in which:

FIG. 1A shows a simplified schematic illustration of a refrigeration system, according to an embodiment of the invention;

FIG. 1B shows a cooling system portion of the refrigeration system shown in FIG. 1A, according to an embodiment of the invention;

FIG. 1C shows a cooling system portion of the refrigeration system shown in FIG. 1A, according to another embodiment of the invention;

DETAILED DESCRIPTION

Figure 1D:
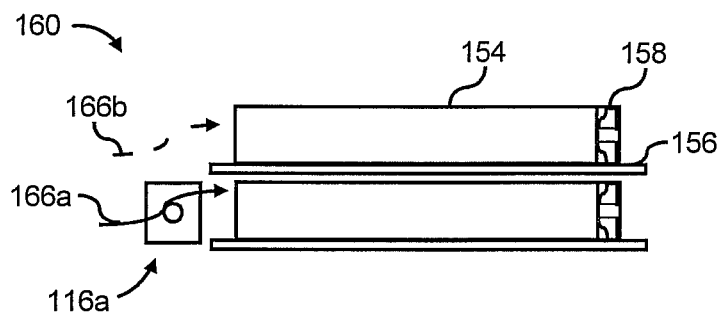
FIGS. 1D-1F depict respective side views, partially in cross section, of three positions at which evaporators may be positioned with respect to components in the refrigeration system depicted in FIG. 1A, according to embodiments of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Broadly speaking, airflow characteristics around various sections of an air-cooled heat generating device may be individually controlled through implementation of the refrigeration system described herein below. The various sections may comprise locations in a front or rear of the heat generating device. Thus, characteristics of air flowing into the heat generating device, characteristics of air flowing out of the heat generating device, or both, may be modified. The various sections may also comprise different levels of the heat generating device, different locations within a heat generating device, etc. More particularly, the granularity at which the airflow characteristics are modified may also be controlled.

The characteristics of the airflow may be modified through use of evaporators positioned directly in the path of the airflow around the heat generating device. In a first example, the evaporators are positioned near inlets of the heat generating device, such that, the evaporators are in the paths of the airflow flowing into the heat generating device. In this example, the evaporators generally operate to reduce the temperature of the airflow flowing into the heat generating device.

In a second example, the evaporators are positioned near the outlets of the heat generating device, such that, the evaporators are in the path of the airflow exhausting from the heat generating device. In this example, the evaporators generally operate to reduce the temperature of the airflow exhausted from the heat generating device. In one regard, the reduction of the exhaust air temperature may reduce the overall temperature of the air in a room housing the heat generating device, for instance. As such, the airflow that may be recirculated, that is, exhausted air that is drawn into the heat generating device, may be at a lower temperature, thereby relatively increasing the ability of the airflow to remove heat from the components in the heat generating device.

In a third example, the evaporators are positioned near both the inlets and outlets of the heat generating device. This configuration of heat exchangers may be implemented in a heat generating device having a relatively high power density, for instance, in excess of 15 kW.

In any of the examples described above, the refrigeration systems may be employed as part of a cooling system that is supplemental to a cooling system of a room. Thus, for instance, substantially only those heat generating devices having relatively high power densities, for instance, in excess of 15 kW, may be equipped with the refrigeration systems. In one regard, the refrigeration systems may be employed to generally ensure that the temperatures of the airflow supplied to the components in the heat generating devices are at rated levels. In another regard, the refrigeration systems may be employed to generally ensure that the temperatures of the airflow supplied into or exhausted from the heat generating device are uniform for a plurality of heat generating devices.

With reference first to FIG. 1A, there is shown a simplified schematic illustration of a refrigeration system 100, according to a first example. It should be readily apparent to those of ordinary skill in the art that the refrigeration system 100 depicted in FIG. 1A represents a generalized illustration and that other components may be added or existing components may be removed or modified without departing from a scope of the refrigeration system 100. For example, the refrigeration system 100 may include any number of evaporators, valves, and various other components.

The refrigeration system 100 is generally configured to manipulate airflow temperatures around various sections of a heat generating device 102 configured to be air-cooled. By way of example, the heat generating device 102 may comprise a standard electronics cabinet configured to house a plurality of components capable of generating/dissipating heat (not shown), for instance, processors, micro-controllers, high-speed video cards, memories, semi-conductor devices, and the like. The components may be elements of a plurality of subsystems (not shown), for instance, computers, servers, hard drives, monitors, memories, etc. The subsystems and the components, hereinafter called heat generating devices, may be implemented to perform various electronic, for instance, computing, switching, routing, displaying, and the like, functions.

The heat generating components may be arranged in the heat generating device 102 in any reasonably suitable manner. For instance, the heat generating components may be positioned horizontally on respective levels of the heat generating device 102. In addition, or alternatively, the heat generating components may be positioned vertically on respective levels of the heat generating device 102, such that a number of heat generating components are arranged on the respective levels of the heat generating device 102.

The refrigeration system 100 may be employed to substantially control the temperature of the airflow supplied into the heat generating device 102 to cool the heat generating device. In addition, or alternatively, the refrigeration system 100 may be employed to substantially control the temperature of the airflow exhausted from the heat generating device 102. In the first instance, the refrigeration system 100 may be positioned upstream from a cooling airflow supplied into the heat generating device 102. In the second instance, the refrigeration system 100 may be positioned downstream of the cooling airflow exhausted from the heat generating device 102. The refrigeration system 100 may be positioned to cool the airflow exhausted from the heat generating device 102 in situations, for instance, where there is a relatively high level of heated air infiltration into the cooling airflow supplied into the heat generating device 102 or into other heat generating devices.

In any respect, the refrigeration system 100 includes a refrigerant line 112 through which a refrigerant flows. The refrigerant line 112 generally forms a loop and is split over a portion thereof into a number of second refrigerant lines 114a-114n, which are arranged in a parallel configuration with respect to each other. The term "parallel" in this context generally refers to the second refrigerant lines 114a-114n as including respective inlets and outlets to the refrigerant line 112, such that each of the second refrigerant lines 112 may receive independent amounts of refrigerant from the refrigerant line. As such, the term "parallel" is not to be construed as indicating that the second refrigerant lines 114a-114n have to be physically parallel to each other.

Positioned along the second refrigerant lines 114a-114n are evaporators 116a-116n, where "n" is an integer equal to or greater than one. Although a plurality of evaporators 116a-116n have been illustrated in FIG. 1A, it should be understood that any reasonably suitable number of evaporators, including a single evaporator 116a, may be employed to cool the heat generating device 102 or the components housed therein. The evaporators 116a-116n may comprise any reasonably suitable configuration designed to cool airflow with a refrigerant. Suitable evaporators may be obtained from, for instance, LYTRON, Inc., of Woburn, Mass., THERMOTEK Co., of Lakeville, Minn., and MODINE MANUFACTURING Co. of Racine, Wis. In addition, the choice of refrigerant employed in the refrigeration system 100 may depend upon a plurality of factors, including, for instance cooling requirements, environmental impact, cost, etc. Generally speaking, suitable refrigerants include the suite of vapor compression hydrocarbon refrigerants (CFC's, HCFSs, HFCs, or any blend of pure refrigerants). Suitable refrigerants may include, for instance, R134a, R290, R600, and the like.

As shown, the evaporators 116a-116n include structures, such as, fins, or other structures having relatively large surface areas, for cooling airflow that passes by the evaporators 116a-116n. Thus, as the airflow passes by the evaporators 116a-116, the airflow is cooled through transfer of heat into the refrigerant flowing through the evaporators 116a-116n. In addition, the amount of heat removed from the airflow may substantially be controlled through control of the refrigerant flowing through the evaporators 116a-116n. More particularly, valves 118a-118n, where "n" is an integer equal to or greater than one, are positioned to meter the flow of refrigerant through respective evaporators 116a-116n. The valves 118a-118n are hereinafter considered "evaporator valves" to distinguish them from other valves in the refrigeration system 100. The use of the terms "evaporator valves" should not, however, be construed as limiting the evaporator valves 118a-118n in any respect.

The evaporator valves 118a-118n may enable a greater amount of refrigerant flow through the evaporators 116a-116n to enable a greater amount of heat transfer from the airflows to the refrigerant, to thereby reduce the temperatures of the airflows. In addition, the evaporator valves 118a-118n may be operated in substantially independent manners to thereby vary the temperatures of the airflows at different levels of the heat generating device 102.

Although the evaporator valves 118a-118n have been illustrated as being positioned upstream of the evaporators 116a-116n, the evaporator valves 118a-118n may be positioned downstream of the evaporators 116a-116n or within the evaporators 116a-116n without departing from a scope of the refrigeration system 100. In addition, although each of the evaporator valves 118a-118n have been illustrated as being positioned to control refrigerant flow into respective evaporators 116a-116n, one or more of the evaporator valves 118a-118n may be configured to control refrigerant flow into two or more of the evaporators 116a-116n without departing from a scope of the refrigeration system 100.

In operation, the refrigerant flows through the evaporators 116a-116n and absorbs heat from the airflow around the evaporators 116a-116n. The heated refrigerant flows through a cooling system 120, where the refrigerant is cooled and supplied back through the evaporators 116a-116n. As shown in FIG. 1A, the cooling system 120 includes a variable speed compressor 122. The compressor 122 is considered to be a "variable speed" compressor because the compressor 122 may be controlled to either increase or decrease the mass flow rate of refrigerant flow through the compressor 122. In other words, the variable speed compressor 122 may operate to pressurize the refrigerant to various levels, either dependent or independent of the actuations of the evaporator valves 118a-118n.

The refrigerant exiting the variable speed compressor 122 flows through a condenser 124 and then through an expansion valve 126 before being supplied back through the evaporators 116a-116n, as shown by the arrow 128. A more detailed description of the devices comprising the cooling system 120 is set forth herein below with respect to FIG. 3.

As also shown in FIG. 1A, the cooling system 120 is depicted as forming part of the heat generating device 102. As such, for instance, the cooling system 120 may be integrally formed with the heat generating device 102. Alternatively, however, the cooling system 120, including the evaporators 116a-116n, may be positioned with respect to an existing heat generating device 102. In either case, the cooling system 120 may be positioned at various other locations with respect to the heat generating device 102 with departing from a scope of the refrigeration system 100. For instance, the cooling system 120 may be positioned on a top or middle portion of the heat generating device 102, outside of the heat generating device 102, in a different heat generating device, etc. As such, the depiction of the cooling system 120 being located beneath a raised floor 130 is for purposes of illustration and it should thus be understood that the cooling system 120 may also be positioned above the raised floor 130.

Alternatively, however, the cooling system 120 may comprise a module separate from part of the refrigerant line 112 and the evaporators 116a-116n. More particularly, for instance, as shown in FIG. 1B, the cooling system 120 includes connectors 136 for removably connecting the refrigerant line 112 of the cooling system 120 to the remaining refrigerant line 112 through which the evaporators 116a-116n receive refrigerant. The connectors 136 may comprise any reasonably suitable and commercially available dripless disconnects. The connectors 136 may be employed, for instance, in configurations where the evaporators 116a-116n are positioned on a movable door of the heat generating device 102. More particularly, for instance, the connectors 136 may be employed to enable the cooling system 120 to be disconnected from the evaporators 116a-116n when the door of the heat generating device 102 is opened.

Although not shown, the condenser 124 may include one or more fans to cool the refrigerant by causing a forced airstream to flow through the condenser 124. In addition, or alternatively, and as shown in FIG. 1C, the condenser 124 may be cooled through heat transfer with a chilled fluid source (as indicated by the arrow 138). The chilled fluid source may comprise a source located outside of the room in which the heat generating device 102 is located. As shown, the condenser 124 is in thermal contact with a heat exchanger portion 140 of the chilled fluid source and is therefore configured to draw heat from the refrigerant as the refrigerant flows through the condenser 124. The heated fluid flows out of the heat exchanger portion 140 as indicated by the arrow 142. The amount of chilled fluid delivered through the heat exchanger portion 140 may be controlled through operation of a valve 144 configured to meter the chilled fluid flow. In one respect, the valve 144 may be manipulated to meter the flow of fluid therethrough to substantially optimize the efficiency of the compressor 122.

Alternatively, the fluid source (as indicated by the arrow 138) may also comprise a refrigerant loop or another type of cooling loop. As such, the fluid source is not required to comprise a chilled fluid loop, but may comprise other types of cooling loops without departing from a scope of the refrigeration system 100 described herein.

The cooling system 120 may also be configured to cool refrigerant of at least one set of evaporators (not shown) positioned on a heat generating device different from the heat generating device 102. In this regard, the refrigerant line of the at least one other set of evaporators may also flow through the cooling system 120 to thereby cool the refrigerant flowing through the at least one other set of evaporators.

Figure 1E:
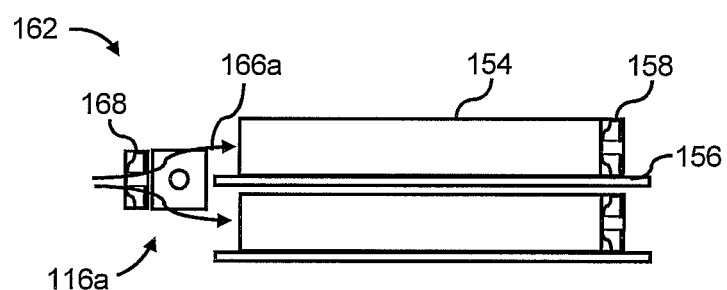
Figure 1F:
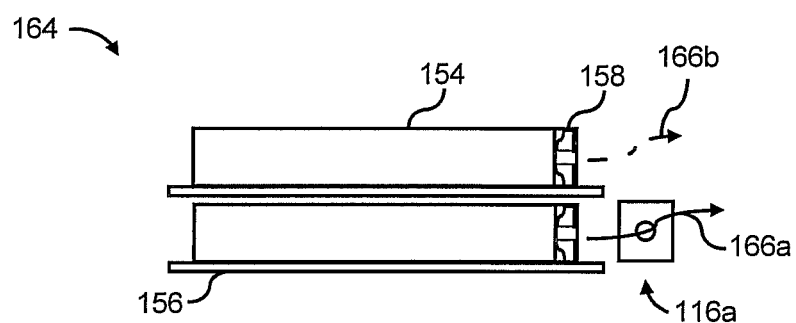

FIGS. 1D-1F depict respective side views 160-164, partially in cross section, of three positions at which the evaporators 116a-116n (only evaporator 116a is shown) may be positioned with respect to components 154 in the heat generating device 102. The components 154 are illustrated as being positioned on respective supports 156 of the heat generating device 102. The side views 160-164 are provided to illustrate examples of various evaporator 116a positions, but it should be understood that other configurations of the evaporator 116a and the components 154 may be employed without departing from a scope of the refrigeration system 100. For instance, with respect to the side views 160 and 162 depicted in FIGS. 1D and 1E, another evaporator 116n may be positioned above the evaporator 116a, on the opposite side of a component 154, etc. As another example with respect to the side view 164 depicted in FIG. 1F, another evaporator 116n may be positioned at an inlet of a component 154, a fan may be included with the evaporator 116a, etc.

As shown in FIGS. 1D-1F, airflow that flows either into or out of the components 154 are indicated by the arrows 166a and 166b. More particularly, the arrows 166a indicate airflows that pass through or otherwise transfer heat with the evaporator 116a and the airflows that do not pass through or otherwise transfer little or no heat with the evaporator 116a are denoted by the arrows 166b. In addition, the airflows may be assisted in flowing through the components 154 through operation of fans 158. The fans 158 may comprise fans that are integrally formed with the components 154. The positions of the fans 158 depicted in FIGS. 1D-1F are for illustrative purposes only and are thus not meant to limit the components 154 in any respect. The airflows through the components 154 may also be assisted through operation of one or more fans 168 positioned to increase airflow through the evaporator 116a, as shown in FIG. 1D.

The fans 168 may be provided on some or all of the evaporators 116a-116n and may span multiple heat exchangers 116a-116n. In addition, the fans 168 may be removably attached to the evaporators 116a-116n such that the fans 168 may be attached to and removed the evaporators 116a-116n as needed or desired. Alternatively, however, the fans 168 may be substantially permanently attached to the evaporators 116a-116n without departing from a scope of the evaporators 116a-116n.

Figure 1G:
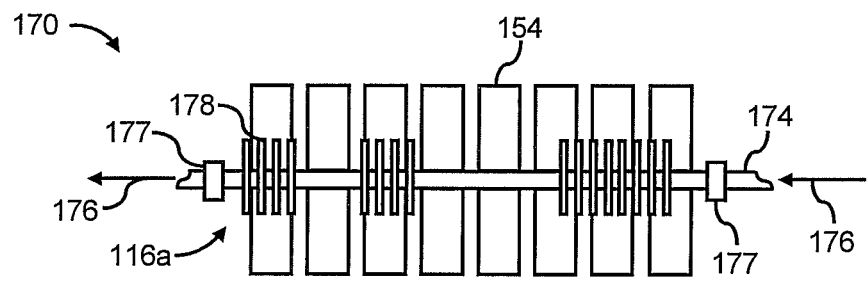
FIGS. 1G and 1H depict views of two possible positions at which evaporators may be positioned with respect to components in the refrigeration system depicted in FIG. 1A, according to embodiments of the invention.
Figure 1H:
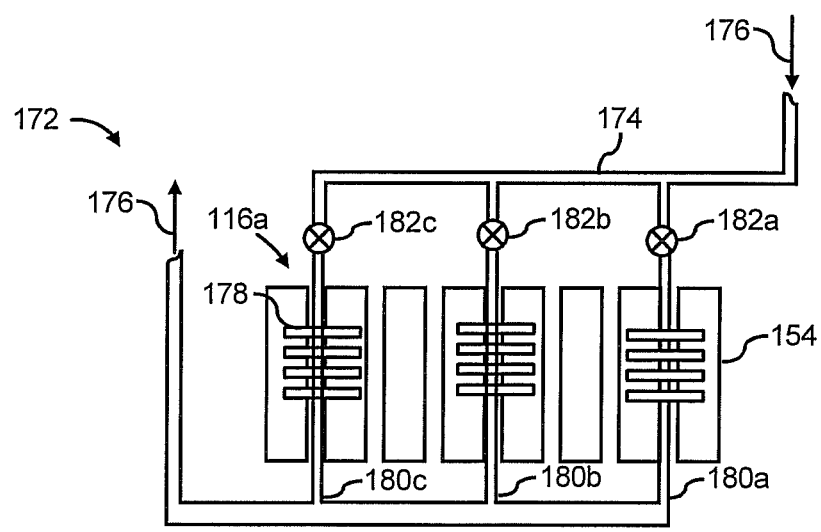

FIGS. 1G and 1H depict views 170 and 172, of two possible positions at which the evaporators 116a-116n (only evaporator 116a is shown) may be positioned with respect to various components 154. The views 170 and 172 may depict either or both of the front and rear views. In this regard, the views 170 and 172 may represent either or both of the inlets and outlets of the components 154. It should be understood that the views 170 and 172 are merely representative of possible configurations of the evaporator 116a and that other configurations are possible within the scope of the refrigeration system 100.

As shown in FIG. 1G, the heat exchanger 116a includes a fluid line 174 through which a refrigerant flows. In this respect, the fluid line 174 may comprise the refrigerant line 112. In addition, the refrigerant is configured to flow through the evaporator 116a as depicted by the arrows 176. Positioned along the fluid line 174 is a plurality of fins 178. The fins 178 may be positioned as shown to enable greater heat removal from airflow supplied to or exhausted from particular ones of the components 154. Greater heat removal may be enabled for those components 154 that generate greater amounts of heat. In addition, the fins 178 may be spaced apart from each other to provide spaces of greater airflow for or from those components 154 that may generate lesser amounts of heat. In this regard, for instance, the evaporator 116a may be configured in various respects to generally enable a relatively high level of customization in cooling airflows supplied into or exhausted from the components 154.

Also shown in FIG. 1G are optional couplings 177 that generally enable the evaporator 116a to be removably attached to the fluid line 174. The optional couplings 177 may comprise any reasonably suitable coupling that enables a fluid line, such as a tube, conduit, etc., to be removably attached to another fluid line. The optional couplings 177 may also comprise features that enable the fluid line 174 to be closed when the evaporator 116a is removed or that enable the fluid line 174 to be manually opened and closed.

Generally speaking, the optional couplings 177 may be provided to enable greater flexibility in the positioning of the evaporators 116a-116n. Thus, for instance, through use of the optional couplings 177, evaporators 116a-116n may be positioned along the fluid line 174 as needed or desired with changes in the positions or thermal characteristics of the components 154.

Referring now to FIG. 1H, the fluid line 174 is arranged to provide varying amounts of refrigerant to respective components 154. More particularly, the fluid line 174 in FIG. 1H is separated into a plurality of sub-lines 180a-180c arranged in parallel with respect to each other. In addition, each of the sub-lines 180a-180c includes a respective valve 182a-182c configured to control the flow of through the sub-lines 180a-180c. In this regard, the amount of refrigerant supplied with respect to various components 154 may be controlled. As such, for instance, the refrigerant flow may substantially be controlled to substantially minimize energy usage in cooling the airflow supplied to or exhausted from the components 154.

Figure 2:
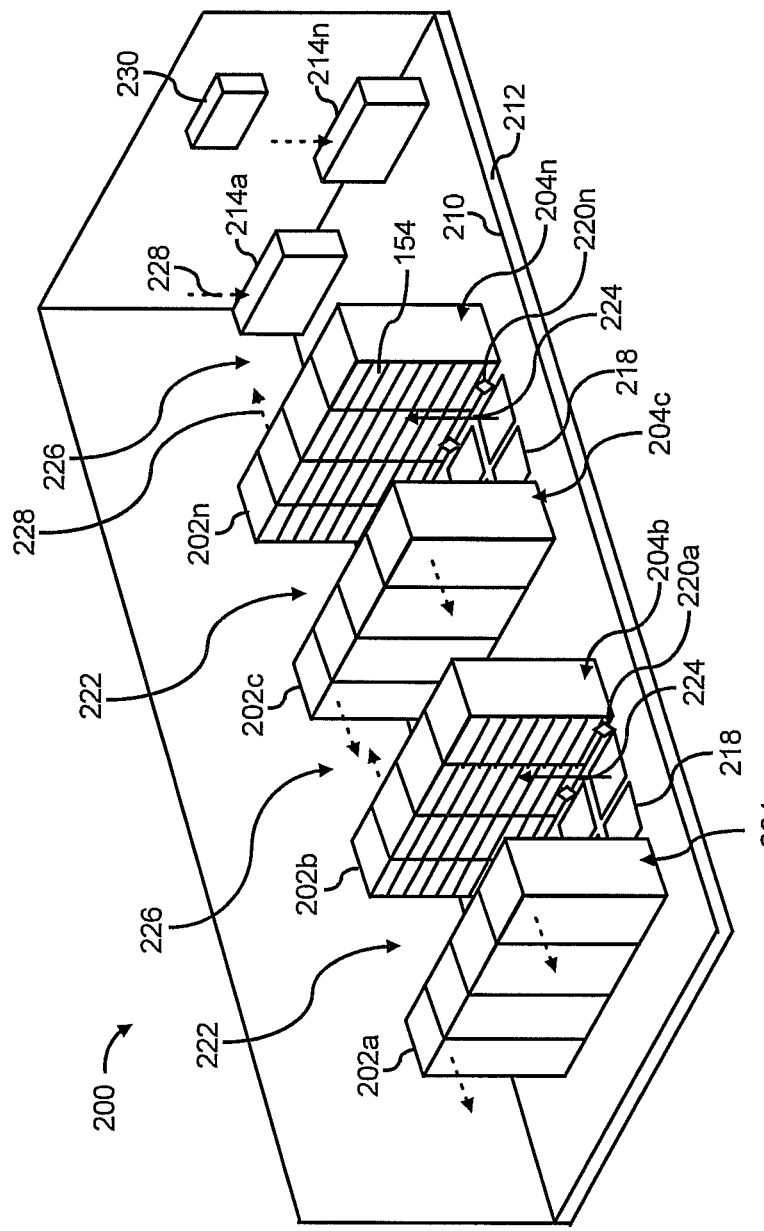
FIG. 2 shows a simplified perspective view of a room containing a number of heat generating devices upon which the refrigeration system depicted in FIG. 1A may be employed, according to an embodiment of the invention.

A number of refrigeration systems 100 may be positioned with respect to one or more heat generating devices 102 contained in a room, as shown, for instance in FIG. 2. More particularly, FIG. 2 shows a simplified perspective view of a section of a room 200 in which the refrigeration system 100 may be implemented. As shown in FIG. 2, the heat generating devices 102 may comprise electronics cabinets or racks 202a-202n housing heat generating components 154, where "n" is an integer equal to or greater than one. As such, one or more of the racks 202a-202n may comprise the configuration of the heat generating device 102 and may include the refrigeration system 100.

The racks 202a-202n are illustrated as being aligned in parallel rows and positioned on a raised floor 210. It should however, be understood that the racks 202a-202n may be arranged in any reasonably suitable configuration and that the racks 202a-202n do not have to be positioned on a raised floor 210. In this regard, for instance, the racks 202a-202n may be positioned in a conventional computer room, such as a data center, or any other reasonably suitable room. The following description of the room 200, however, is directed to a data center environment having a raised floor for purposes of illustration.

The racks 202a-202n are generally configured to house a plurality of components 154 capable of generating/dissipating heat, for instance, processors, micro-controllers, high-speed video cards, memories, semi-conductor devices, and the like. The components 154 may be elements of a plurality of subsystems (not shown), for instance, computers, servers, bladed servers, etc. The subsystems and the components may be operated to perform various electronic functions, for instance, computing, switching, routing, displaying, and the like. A plurality of wires and communication lines (not shown) may be located in a space 212 beneath the raised floor 210. The space 212 may also function as a plenum for delivery of cooled air from one or more actuators.

Also shown in FIG. 2 are air conditioning (AC) units 214a-214n, where "n" is an integer equal to or greater than one. The AC units 214a-214n are generally configured to manipulate a characteristic of the cooled airflow supplied to the racks 202a-202n through actuation of one or more actuators. The actuators may include a device for controlling airflow temperature and a device for controlling the flow rates at which the cooled air is supplied.

The cooled air may be delivered from the space 212 to the racks 202a-202n through vent tiles 218 located between some or all of the racks 202a-202n. The vent tiles 218 may comprise manually or remotely adjustable vent tiles. In this regard, the vent tiles 218 may be manipulated to vary, for instance, the mass flow rates of cooled air supplied to the racks 202a-202n. In addition, the vent tiles 218 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104, the vent tiles 218 are termed "dynamically controllable" because they generally operate to control at least one of velocity, volume flow rate and direction of the cooled airflow therethrough. In addition, specific examples of dynamically controllable vent tiles 218 may be found in U.S. Pat. No. 6,694,759, filed on Jan. 27, 2003, which is assigned to the assignee of the present invention and is incorporated by reference herein in its entirety.

The cooled air contained in the space 212 may include cooled air supplied by one or more AC units 214a-214n. Thus, characteristics of the cooled air, such as, temperature, pressure, humidity, flow rate, etc., may substantially be affected by the operations of one or more of the AC units 214a-214n. In this regard, characteristics of the cooled air at various areas in the space 212 and the cooled air supplied to the racks 202a-202n may vary, for instance, due to mixing of the cooled air. In other words, the characteristics of the cooled air supplied to a particular location in the room 200 may differ from that of the cooled air supplied by a single AC unit 214a.

At least one condition, for instance, temperature, pressure, or humidity, of the cooled air supplied to various areas of the room 200 may be detected by sensors 220a-220n, where "n" is an integer equal to or greater than one. As shown, the sensors 220a-220n are represented as diamonds to distinguish them from other elements depicted in FIG. 2. In addition, the sensors 220a-220n are depicted as being positioned to detect the at least one condition at the inlets of the racks 202a-202n. In this example, the sensors 220a-220n may comprise temperature sensors or absolute humidity sensors. In another example, the sensors 220a-220n may be positioned within the space 212 near respective vent tiles 218 to detect the temperature, pressure, or humidity of the cooled air supplied through the respective vent tiles 218. Thus, although the sensors 220a-220n are depicted as being located on the raised floor 210, the sensors 220a-220n may be positioned at various other reasonably suitable locations, including, for example, near or within some or all of the components 154. The sensors 220a-220n may also form part of the evaporators 116a-116n, for instance, on exhaust sides of the evaporators 116a-116n.

The areas between the rows labeled as 204a and 204b and between the rows labeled as 204c and 204n may comprise cool aisles 222. These aisles are considered "cool aisles" because they are configured to receive cooled airflow from the vent tiles 218, as generally indicated by the arrows 224. In addition, and as shown, the racks 202a-202n generally receive cooled air from the cool aisles 222. The aisles between the rows labeled as 204b and 204c, and on the rear sides of rows 204a and 204n, are considered hot aisles 226. These aisles are considered "hot aisles" because they are positioned to receive air that has been heated by the components 154 in the racks 202a-202n, as indicated by the arrows 228.

Although not shown, some or all of the racks 202a-202n may be positioned to each face the same direction, such that there are no distinct "hot aisles" and "cool aisles". Additionally, some or all of the racks 202a-202n may be positioned with their rear sides adjacent to one another. In this example, the vent tiles 218 may be provided in each aisle 222 and 226. In addition, the racks 202a-202n may comprise outlets on top panels thereof to enable heated air to flow out of the racks 202a-202n.

As described herein above, the AC units 214a-214n generally operate to cool heated air (arrows 228) received into the AC units 214a-214n. In addition, the AC units 214a-214n may supply the racks 202a-202n with airflow that has been cooled, through any reasonably suitable known manners and may thus comprise widely available, conventional AC units. For instance, the AC units 214a-214n may comprise vapor-compression type air conditioning units, chilled water air conditioning units, etc. Examples of suitable AC units 214a-214n may be found in co-pending and commonly assigned U.S. patent application Ser. No. 10/853,529, filed on May 26, 2004, and entitled "Energy Efficient AC Unit Operation," the disclosure of which is hereby incorporated by reference in its entirety.

One or more of the racks 202a-202n may include the refrigeration system 100 positioned to either cool airflow supplied into the one or more racks 202a-202n or to cool airflow exhausted from the one or more racks 202a-202n. In this regard, the refrigeration system 100 positioned with respect to the one or more racks 202a-202n may operate to supplement the cooling provided by the AC units 214a-214n. By way of example, the supplemental cooling may be provided to cool airflow delivered to or exhausted from those racks 202a-202n that dissipate comparatively large amounts of heat. As another example, the supplemental cooling may be provided to cool airflow exhausted from racks 202a-202n known to contribute to adverse re-circulation of heated airflow into cooling airflow supplied into the racks 202a-202n.

Also shown in FIG. 2 is a resource manager 230 configured to perform various functions in the room 200. For instance, the resource manager 230 may operate the AC units 214a-214n based upon received information, such as, temperatures at various areas of the room 200. The resource manager 230 may also operate other elements in the room 200, including, for instance, controllable vent tiles 218. In addition or alternatively, the resource manager 230 may operate to control the placement of workload among the components 154 in the room 200.

Although the resource manager 230 is illustrated in FIG. 2 as comprising a component separate from the components 154 housed in the racks 202a-202n, the resource manager 230 may comprise one or more of the components 154 without departing from a scope of the room 200 disclosed herein. In addition, or alternatively, the resource manager 230 may comprise software configured to operate on a computing device, for instance, one of the components 154.

Figure 3:
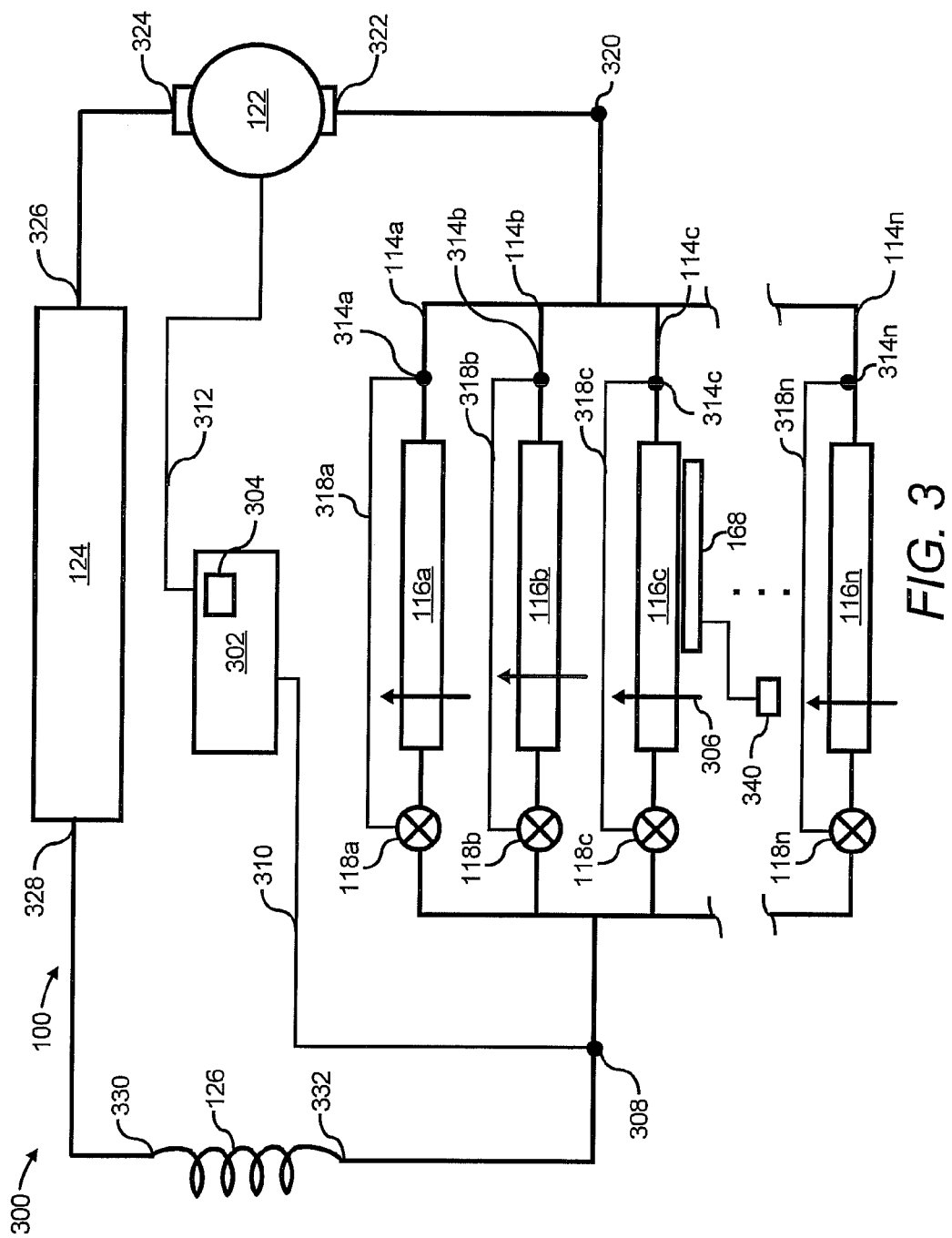
FIG. 3 shows a schematic diagram of the refrigeration system shown in FIG. 1A, according to an embodiment of the invention.

With reference now to FIG. 3, there is shown a schematic diagram 300 of the refrigeration system 100. In addition to the refrigeration system 100 components, including, the evaporators 116a-116n, the evaporator valves 118a-118n, the variable speed compressor 122, the condenser 124, and the evaporator 126 described hereinabove with respect to FIGS. 1A-1H, the schematic diagram 300 also depicts a controller 302, a relay 304, and a plurality of sensors. As such, the schematic diagram 300 illustrates a manner in which some or all of the refrigeration system 100 components may be operated to vary airflow conditions around one or more of the heat generating devices 102, 202a-202n.

Generally speaking, airflow conditions (as indicated by the arrows 306) may be controlled through manipulation of the variable speed compressor 122 and the evaporator valves 118a-118n. More particularly, for instance, operations of the variable speed compressor 122 may be varied to either increase or decrease the mass flow rate of refrigerant flow 306 therethrough. A number of different types of reasonably suitable and commercially available variable speed compressors may be employed in the refrigeration system 100 without departing from a scope of the schematic diagram 300. In addition, the evaporator valves 118a-118n may be tightened or loosened to thereby vary the flow of refrigerant supplied into the respective evaporators 116a-116n. The ellipse between the evaporator 116c and the evaporator 116n generally indicates that any reasonably suitable number of evaporators 116n may be included in the control system 300.

Operations of the variable speed compressor 122 may be controlled by the controller 302 based upon various inputs received from a sensor 308 configured to measure the evaporator saturation temperature ("$T_{sat}$"). The sensor 308 may comprise any reasonably suitable type of temperature sensor, for instance, a thermocouple, a thermistor, a pressure sensing device, if the refrigerant is azeotropic (that is, the evaporator saturation temperature is constant over a phase change), and the like. As shown, the sensor 308 is positioned to detect the saturation temperature of the refrigerant in the refrigerant line 112 at a location upstream of the evaporator valves 118a-118n. In addition, the sensor 308 is configured to transmit the detected saturation temperatures to the controller 302 via a signal line 310.

The controller 302, which may comprise a proportional, integral, derivative (PID) control system with a relay 304, may compare the detected saturation temperatures to setpoint saturation temperatures. Depending upon the differences between the detected saturation temperatures and the setpoint saturation temperatures, the controller 302 may transmit a control signal to the variable speed compressor 122 via a control line 312. Although any suitable PID control system 302 and relay 304 may be utilized with the refrigeration system 100, examples of suitable PID control systems 302 include those manufactured by OMEGA Inc. of Stamford, Conn., and WATLOW ELECTRIC MANUFACTURING CO. of St. Louis, Mo.

The sensor 308 may also comprise one or more sensors configured and positioned to detect temperatures at one or more locations in a heat generating device 102, 202a-202n. In this example, the controller 302 may compare the temperatures detected by the one or more sensors and the sensor having the highest temperature may serve as the control point for the controller 302 to control the variable speed compressor 122.

The evaporator valves 118a-118n may be controlled to meter the flow of refrigerant delivered into the evaporators 116a-116n based upon inputs received from respective sensors 314a-314n. The sensors 314a-314n may comprise, for instance, thermocouples, thermistors, pressure sensing devices, etc., which are positioned downstream of respective evaporators 116a-116n. More particularly, the sensors 314a-314n are configured to measure the temperature of the superheat temperature ("$\Delta T_{sup}$") of the refrigerant as it exits the respective evaporators 116a-116n along the respective second refrigerant lines 114a-114n. Generally speaking, the evaporator valves 118a-118n respond to changes in the $\Delta T_{sup}$ to meter the flow of the refrigerant into respective evaporators 116a-116n. In one example, changes in the $T_{sup}$, may cause bimetallic strips inside the evaporator valves 118a-118n to actuate, thus manipulating the evaporator valves 118a-118n to vary the flow of refrigerant into the respective evaporators 116a-116n. In any regard, the detected changes in temperature may be relayed to the evaporator valves 118a-118n via respective temperature signal lines 318a-318n.

It is to be understood that a specific type of evaporator valve 118a-118n is not required to be utilized in the refrigeration system 100, but rather, any reasonably suitable type of controllable metering valve, for instance, a thermal electric valve, may be utilized. An example of a suitable evaporator valve includes valves manufactured by PARKER-HANNEFIN CORP. of Cleveland, Ohio.

In one respect, the mass flow rates of refrigerant flowing through the evaporators 116a-116n may be metered according to the amount of heat generated by the components 154 associated with the evaporators 116a-116n. That is, for instance, the mass flow rates of refrigerant supplied into those evaporators 116a-116n positioned to cool airflow around components 154 generating relatively large amounts of heat may substantially be higher than those evaporators 116a-116n associated with components 154 (shown, for instance, in FIGS. 1D-1H) generating relatively lesser amounts of heat. In addition, the evaporator valves 118a-118n may be controlled, such that, the evaporators 116a-116n receive substantially only a relatively necessary amount of refrigerant to adequately cool the airflows in their respective vicinities without allowing significant amounts of refrigerant, in liquid form, to flow into the variable speed compressor 122. Thus, the temperatures of airflows supplied into or exhausted from the components 154 may be maintained at relatively constant temperatures to thereby reduce temperature variations around the components 154.

After the refrigerant exits the evaporators 116a-116n, the refrigerant is introduced back into the refrigerant line 112. In addition, a sensor 320, for instance, a thermocouple, a thermistor, a pressure sensing device, etc., is provided to detect the suction temperature ("$T_{suction}$") of the refrigerant prior to entering the variable speed compressor 122.

The refrigerant enters the variable speed compressor 122 through a compressor inlet 322. The variable speed compressor 122 increases the pressure and temperature of the refrigerant before the refrigerant exits through a compressor outlet 324. The speed of the variable speed compressor 122 and thus the level of compression of the refrigerant may be controlled by the controller 302, as described above.

The refrigerant flows out of the variable speed compressor 122 and through the refrigerant line 112 into the condenser 124 through a condenser inlet 326. Within the condenser 124, the refrigerant begins to decrease in temperature while remaining at a constant pressure, until the refrigerant reaches a saturation point. The refrigerant exits the condenser 124 through a condenser outlet 328, typically as a liquid (still at a relatively high pressure and temperature). The refrigerant then flows through the refrigerant line 112 into the expansion valve 126 through an expansion valve inlet 330. The pressure of the refrigerant is reduced within the expansion valve 126 before exiting the expansion valve 126 through an expansion valve outlet 332. The refrigerant, in substantially liquid form, is then metered through the evaporators 116a-116n to cool the airflows (indicated by the arrows 306), and the process may be repeated on a substantially continuous basis.

The condenser 124 and the expansion valve 126 may comprise any of a number of known or heretofore known condensers and expansion valves and may thus comprise any reasonably suitable type of condenser and expansion valve which substantially adequately performs their respective functions within a refrigeration system. Examples of expansion valves suitable for use in the refrigeration system 100 include capillary tubes, constant pressure expansion valves, and the like.

Also shown in FIG. 3 is a fan 168 positioned with respect to the evaporator 116c. As described above with respect to FIGS. 1D-1F, the fan 168 may be employed to substantially increase the flow rate of airflow over one or more of the evaporators 116a-116n. The fan 168 may be set to operate at a predefined level when activated. In addition, or alternatively, the fan 168 may be operated according to a condition detected by, for instance, a sensor 340. More particularly, for instance, the fan 168 may include control logic (not shown), such as, a PID controller, a programmable logic controller, etc., configured to operate the fan 168 based upon the conditions detected by the sensor 340. As a further example, fans 168 may be positioned with respect to each of the evaporators 116a-116n and operated at minimum levels to substantially prevent freezing in the evaporators 116a-116n.

In a first example, the sensor 340 may comprise one or more sensors positioned to take static or differential air pressure measurements around the evaporator 116c. In this example, the speed of the fan 168 may be modified according to, for instance, static pressure build up between the evaporator 116c and a component 154.

In a second example, the sensor 340 may comprise one or more sensors configured to detect the temperatures of the components 154, sensors to detect the temperatures or statuses of the cooling fluid exiting the evaporators 116a-116n, sensors configured to detect mass airflow rates through a component 154 (either directly measured or through calculations based upon temperature differences across the component 154), etc. In this example, the fan 168 speed may be modified according to one or more of the conditions detected by the sensor 340.

Figure 4:
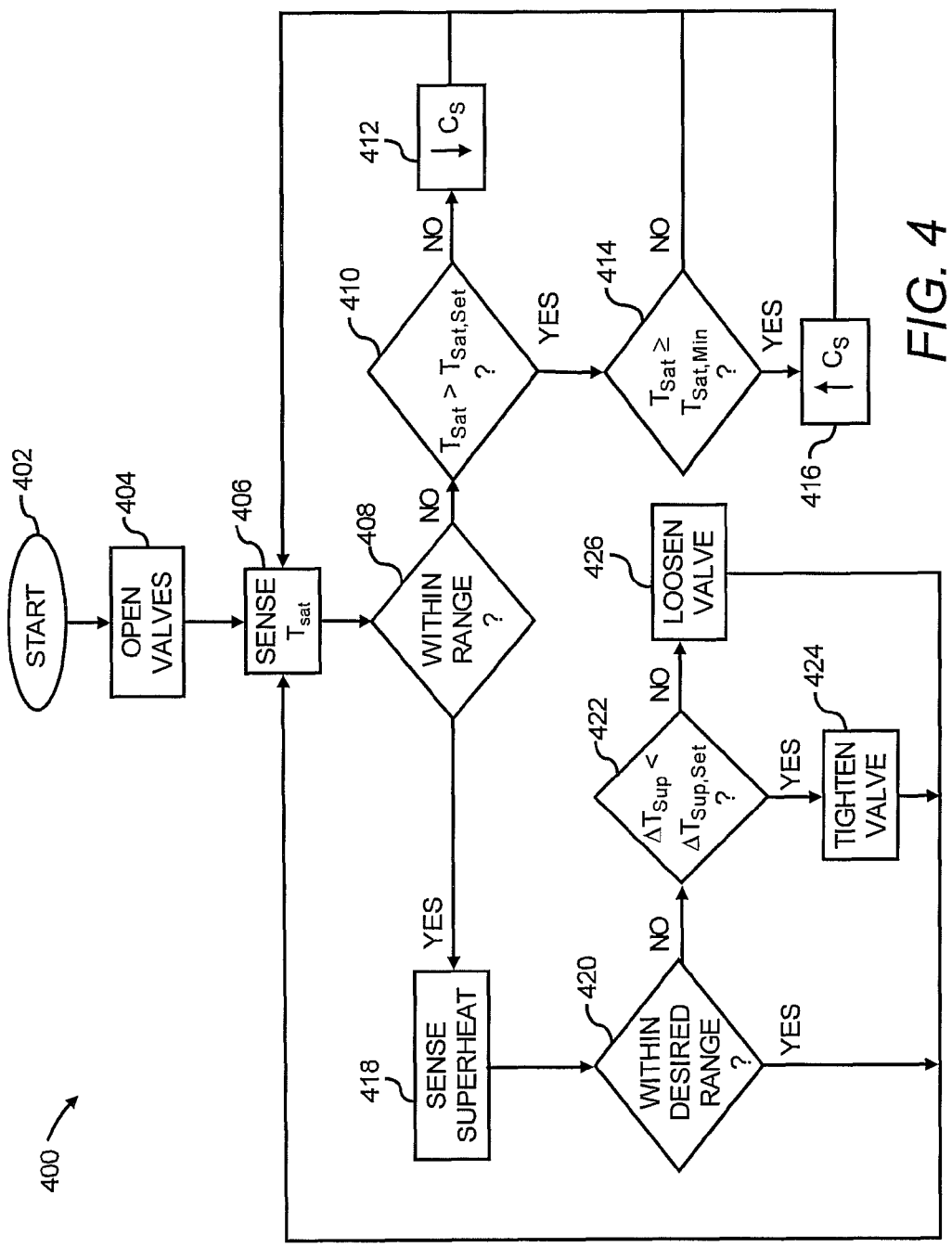
FIG. 4 shows a flow diagram of a method for controlling the airflow around one or more heat generating devices, according to an embodiment of the invention.

With particular reference now to FIG. 4, there is shown a flow diagram of a method 400 for controlling the airflow around one or more heat generating devices 102, 202a-202n, according to an example. It is to be understood that the following description of the method 400 is but one manner of a variety of different manners in which an example of the refrigeration system 100 may be practiced. It should also be apparent to those of ordinary skill in the art that the method 400 represents a generalized illustration and that other steps may be added or existing steps may be removed, modified or rearranged without departing from a scope of the method 400. Although particular reference to the elements shown in FIG. 3 is made in the description of the method 400, it should be understood that the method 400 is not limited to being implemented by the elements shown in FIG. 3 and may be implemented by more, less, or different elements as those shown in FIG. 3.

Generally speaking, the method 400 may be implemented to substantially control airflow around one or more heat generating devices 102, 202a-202n. More particularly, for instance, the method 400 may be implemented to substantially control at least one of the temperature and the flow rate of airflow delivered into one or more of the heat generating devices 102a, 202a-202n to provide one or both of uniform inlet and outlet temperatures. In addition, or alternatively, the method 400 may be implemented to substantially control at least one of the temperature and the flow rate of the airflow exhausted from one or more of the heat generating devices 102, 202a-202n. The method 400 may be implemented as a substantially stand-alone airflow control method. In other words, the method 400 may be employed to substantially control airflow around the heat generating devices 102, 202a-202n substantially independently of a larger scale air conditioning unit, such as, the AC units 214a-214n.

In any event, the method 400 may be initiated at step 402 in response to any of a number of stimuli or conditions. For instance, the method 400 may be initiated with activation of one or more systems, such as, the refrigeration systems 100, the components 154, the AC units 214a-214n, etc. After the method 400 has been initiated, the evaporator valves 118a-118n may be opened at step 404. As the refrigerant flows through the refrigeration system 100, the saturation temperature ($T_{sat}$) is measured at step 406. As discussed above, the saturation temperature may also be detected through use of one or more sensors configured and positioned to detect temperatures at one or more locations in a heat generating device 102, 202a-202n. In addition, or alternatively, saturation temperatures may be detected at various locations with respect to the evaporators 116a-116n.

The $T_{sat}$ measurement is relayed to the controller 302 via the input line 310. The controller 302, which may comprise a PID controller, compares the detected $T_{sat}$ to a predetermined temperature range, to determine whether detected $T_{sat}$ is within the predetermined temperature range, at step 408. The predetermined temperature range may be based upon system design and the amount of load variability to be expected among the components 154 in a heat generating device 102, 202a-202n. In general, for instance, the predetermined temperature range may depend upon the following: electrical timing requirements, allowable mechanical stress due to thermal expansion, proximity to dew point, etc.

If the controller 302 determines that the $T_{sat}$ is outside of the predetermined temperature range, the controller 302 may also determine whether the $T_{sat}$ is higher than a saturation temperature setpoint ("$T_{sat,set}$") at step 410. The $T_{sat,set}$ may be determined, for instance, by determining the optimum operating temperatures of the components 154 and is generally a function of component 154 design, airflow efficiency through the components 154, locations of the evaporators 116a-116n with respect to the components 154, and the like. In addition, or alternatively, the saturation temperature setpoint may comprise a predetermined threshold to dew point temperature, for instance, within 1-5 degrees C. of the predetermined threshold. More particularly, at step 410, the controller 302 may compare the saturation temperatures around the evaporators 116a-116n to determine whether the saturation temperatures may cause condensation on the evaporators 116a-116n.

If the $T_{sat}$ is equal to or below the $T_{sat,set}$, the speed of the variable speed compressor 122 may be reduced by a controlled amount, as indicated at step 412. By reducing the speed of the variable speed compressor 122, the mass flow rate of the refrigerant entering into the evaporators 116a-116n will be decreased and the $T_{sat}$ will be increased.

If, on the other hand, the $T_{sat}$ is higher than the $T_{sat,set}$, the controller 302 may determine whether a reduction in temperature of the refrigerant supplied to the evaporators 116a-116n is likely to cause condensation on the evaporators 116a-116n, as may occur if the saturation temperatures reach the dew point temperature. More particularly, the controller 302 may determine whether the $T_{sat}$ is equal to or exceeds a minimum allowable saturation temperature ($T_{sat,min}$), at step 414. The $T_{sat,min}$ may be equivalent to a minimum threshold temperature allowable prior to condensation forming on the evaporators 116a-116n. That is, the $T_{sat,min}$ may be equivalent to a threshold temperature related to dew point temperature.

At step 414, if the $T_{sat}$ equals or exceeds the $T_{sat,min}$, the speed of the variable speed compressor 122 may be increased by a controlled amount, as indicated at step 416. Increasing the speed of the variable speed compressor 122 has the effect of increasing the mass flow rate of the refrigerant entering into the evaporators 116a-116n while reducing the $T_{sat}$. If, however, the $T_{sat}$ falls below the $T_{sat,min}$, the variable speed compressor 122 may remain unchanged and the method 400 may be repeated beginning at step 406. The method 400 may also be repeated beginning at step 406 following each of steps 412 and 414.

If the $T_{sat}$ is determined to be within the desired range at step 408, the evaporator superheat temperature ("$\Delta T_{sup}$") for the evaporators 116a-116n may be sensed by the respective sensors 314a-314n at step 418. At step 420, it is determined whether the $\Delta T_{sup}$ for each of the evaporators is 116a-116n is within a predetermined desired range. For those evaporators 116a-116n whose $\Delta T_{sup}$ is within the desired range, no change is made to the associated evaporator valve 118a-118n. However, for those evaporators 116a-116n whose $\Delta T_{sup}$ is outside of the desired range, the $\Delta T_{sup}$ for that evaporator 116a-116n is compared to an evaporator superheat setpoint ("$\Delta T_{sup,set}$") at step 422. According to one example, the $\Delta T_{sup,set}$ for the evaporators 116a-116n may be about between 0-5 degrees C.

Thus, for example, for those evaporators 116a-116n whose $\Delta T_{sup}$ is below the respective $\Delta T_{sup,set}$ for those evaporators 116a-116n, the evaporator valves 118a-118n for those evaporators 116a-116n may be manipulated by a controlled amount to decrease the mass flow rates of refrigerant flowing into those evaporators 116a-116n, at step 424. In one regard, manipulation of the evaporator valves 118a-118n to reduce the mass flow rates of refrigerant supplied through the evaporators 116a-116n may cause the $\Delta T_{sup}$ to be increased while reducing the $T_{sat}$.

For those evaporators 116a-116n whose $\Delta T_{sup}$ is not less than the respective $\Delta T_{sup,set}$ for those evaporators 116a-116n, the evaporator valves 118a-118n for those evaporators 116a-116n may be manipulated to increase the mass flow rates of refrigerant supplied into those evaporators 116a-116n by a controlled amount, as indicated at step 426. In one regard, the increase in the mass flow rates of refrigerant supplied through the evaporators 116a-116n may cause the $\Delta T_{sup}$ to be decreased while increasing the $\Delta T_{sat}$. After the evaporator valves 118a-118n have been manipulated to either increase or decrease the flow of refrigerant therethrough, steps 406-426 may be repeated.

Although steps 418-426 have been described as being performed through use of logic determinations, these steps may be performed through use of relatively simpler configurations. For instance, a physical shift in the sensors 314a-314n may be caused based upon the superheat in the refrigerant exiting the respective evaporators 116a-116n. The evaporator valves 118a-118n may be operated based upon the physical shift in the sensors 314a-314n. In this regard, for instance, the changing conditions detected by the sensors 314a-314n may cause bimetallic strips inside the evaporator valves 118a-118n to actuate, thus manipulating the evaporator valves 118a-118n to thereby vary the refrigerant flow through the respective evaporators 116a-116n. As such, actuation of the evaporator valves 118a-118n may be directly related to the superheat of the refrigerant exiting the evaporators 116a-116n.

In addition, steps 406-426 may be repeated in a substantially continuous manner and for any reasonably suitable length of time. For instance, steps 406-426 may be repeated for so long as the various systems listed above remain operational. As such, the method 400 may be ended once the various systems are turned off. In addition, or alternatively, the method 400 may be manually ended.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for controlling airflow around at least one heat generating device through use of a refrigeration system, said refrigeration system having a refrigerant line through which a refrigerant flows and evaporators positioned along the refrigerant line in a parallel arrangement with respect to each other, said evaporators also being positioned in the path of at least one of airflow supplied into and airflow exhausted from the at least one heat generating device, said method comprising:

detecting a saturation temperature of the refrigerant upstream of the evaporators;

determining whether the detected saturation temperature exceeds a saturation temperature setpoint, wherein the saturation temperature setpoint comprises a predetermined threshold to dew point temperature;

determining whether the detected saturation temperature is equal to or exceeds a minimum allowable saturation temperature in response to the saturation temperature exceeding the predetermined threshold to dew point temperature; and increasing the speed of a variable speed compressor to compress the refrigerant in the refrigerant line in response to the detected saturation temperature equaling or exceeding the minimum allowable saturation temperature to vary the flow of refrigerant through the evaporators and to thereby control the airflow around the at least one heat generating device.

* * * * *

UNITED STATES PATENT AND TRADEMARK OFFICE
CERTIFICATE OF CORRECTION

| | | |
|---|---|---|
| PATENT NO. | : 8,561,418 B2 | Page 1 of 1 |
| APPLICATION NO. | : 13/018082 | |
| DATED | : October 22, 2013 | |
| INVENTOR(S) | : Cullen E. Bash et al. | |

It is certified that error appears in the above-identified patent and that said Letters Patent is hereby corrected as shown below:

In the Specification

In column 1, line 17, delete "11/142,5557," and insert -- 11/142,557, --, therefor.

Signed and Sealed this
Twenty-seventh Day of May, 2014

Michelle K. Lee
*Deputy Director of the United States Patent and Trademark Office*